(12) United States Patent
    Jingming

(10) Patent No.: US 9,380,377 B2
(45) Date of Patent: Jun. 28, 2016

(54) DIRECTIONAL MEMS MICROPHONE AND RECEIVER DEVICE

(71) Applicant: Shandong Gettop Acoustic Co., Ltd., Fangzi Development Zone (CN)

(72) Inventor: Wan Jingming, Weifang (CN)

(73) Assignee: SHANDONG GETTOP ACOUSTIC CO., LTD (CN)

(*) Notice: Subject to any disclaimer, the term of this patent is extended or adjusted under 35 U.S.C. 154(b) by 58 days.

(21) Appl. No.: 14/270,858

(22) Filed: May 6, 2014

(65) Prior Publication Data

US 2015/0181346 A1    Jun. 25, 2015

(30) Foreign Application Priority Data

Dec. 23, 2013  (CN) .......................... 2013 1 0718505

(51) Int. Cl.
    *H04R 1/20*     (2006.01)
    *H04R 1/34*     (2006.01)
    *H04R 1/02*     (2006.01)
    *H04R 1/28*     (2006.01)

(52) U.S. Cl.
    CPC .................. *H04R 1/342* (2013.01); *H04R 1/02* (2013.01); *H04R 1/2823* (2013.01); *H04R 2201/003* (2013.01); *H04R 2201/02* (2013.01)

(58) Field of Classification Search
    None
    See application file for complete search history.

(56) References Cited

U.S. PATENT DOCUMENTS

| | | | |
|---|---|---|---|
| 8,823,115 B2 * | 9/2014 | Inoda et al. | 257/416 |
| 8,879,767 B2 * | 11/2014 | Wickstrom | 381/361 |
| 2008/0150104 A1 * | 6/2008 | Zimmerman et al. | 257/676 |
| 2009/0074222 A1 * | 3/2009 | Song | 381/357 |
| 2009/0116669 A1 | 5/2009 | Song | |
| 2012/0250897 A1 | 10/2012 | Michel | |
| 2014/0225204 A1 * | 8/2014 | Nakagawa et al. | 257/416 |

FOREIGN PATENT DOCUMENTS

| CN | 101296530 A | 10/2008 |
|---|---|---|
| CN | 101296531 A | 10/2008 |
| CN | 101677423 A | 3/2010 |
| CN | 102740206 A | 10/2012 |
| CN | 203193895 U | 9/2013 |
| CN | 203840541 U | 9/2014 |

* cited by examiner

*Primary Examiner* — Andrew L Sniezek
(74) *Attorney, Agent, or Firm* — Cantor Colburn LLP

(57) ABSTRACT

The present invention provides a directional MEMS microphone and a receiver device wherein MEMS microphone comprises a microphone cover, a printed circuit board (PCB), a application specific integrated circuit (ASIC) chip, a MEMS die, a diaphragm, a damping, a metal wire(s), at least two internal acoustic ports and at least two external acoustic ports corresponding to the internal acoustic ports. The microphone further comprises a tuning cavity which includes a first tuning cavity by which a first internal acoustic port is communicated with a first external acoustic port, or by which a second internal acoustic port is communicated with a second external acoustic port. Compared with the prior art, the directional MEMS microphone including the tuning cavity to form a sound transmission channel by connecting the internal acoustic port and the external acoustic port expands the sound transmission distance, thereby increasing the sensitivity the directivity of the MEMS microphone.

10 Claims, 8 Drawing Sheets

DIRECTIONAL MEMS MICROPHONE AND RECEIVER DEVICE

CROSS-REFERENCE TO RELATED APPLICATIONS

This application is related to and claims the benefit of Chinese Patent Application No. 201310718505.7 filed on Dec. 23, 2013, the entire contents of which are herein incorporated by reference.

FIELD OF THE INVENTION

This invention relates generally to a microphone technology field. More particularly, this invention relates to a directional MEMS microphone and a receiver device.

BACKGROUND OF THE INVENTION

The MEMS microphone, also called MEMS transducer, refers to a microphone fabricated with Microelectromechanical System technology.

The microphone contains two chips, a MEMS die and an Application Specific Integrated Circuit (ASIC) chip which are packaged into a surface mountable package. The MEMS die contains a rigid perforated back electrode and an elastic silicon diaphragm serving as a capacitor which can transform the sound wave into the capacitance changes. The ASIC chip is used to detect the capacitance changes and output electrical signals.

Compared with the conventional Electret Condenser Microphone (ECM), the MEMS microphone has not only a very good acoustic performance but also a higher SNR and a more consistent sensitivity, as well as a very stable performance while subjected to various temperatures. Another prominent advantage of the MEMS microphone is that its power consumption is very low, only 70 µW in average with an operating voltage range 1.5V~3.3V. Moreover, compared with the conventional ECM, it is easier for the MEMS microphone to be incorporated into a microphone array which has a high stability. Combined with the consequent voice algorithm, the microphone array can achieve the voice directivity and improve the communicating quality. Based on above features, the MEMS microphones are widely used in smart phones, consumer electronics, laptops, medical apparatuses such as hearing aids, vehicle industry such as hands-free communicating devices, even in other industry fields as well, such as monitoring machine running state with a sound wave transducer.

The microphone directivity refers to the receiving capacity of the microphone to sounds from different angles. More particularly, the directional capacity is normally reflected by the directional angle. If the directional angle of a microphone is larger, the pickup range is wider but it also has a higher risk of howling caused by picking sounds from loudspeaker field. However, if the directional angle is decreased, the pickup range of the microphone is also decreased correspondingly.

Referring to FIG. 1a and FIG. 1b, the detailed structure of the existing directional MEMS microphone is depicted, comprising: PCB 1, acoustic port 2, MEMS die bonding adhesive 3, metal wire 4, ASIC chip 5, ASIC bonding adhesive 6, ASIC coating adhesive 7, microphone cover 8, cover bonding adhesive or solder paste 9, MEMS die 11, damping adhesive 12, damping 13, acoustic port 10, and pad 20. The PCB 1 is secured on the mounting position by the pads 20. The microphone cover 8 is coupled to the PCB 1 to form a housing with the joint sealed by the cover bonding adhesive or solder paste 9. Inside the housing, the ASIC chip 5 is attached to the PCB 1 by the ASIC bonding adhesive 6 and is packaged by the ASIC coating adhesive 7. The MEMS die 11 is attached to the PCB 1 by the MEMS die bonding adhesive 3. The PCB 1 is provided with the acoustic port 2 and the acoustic port 10 wherein the inner outlet of the port 10 is covered by the damping 13 which is attached along the edge to the PCB 1 by the damping adhesive 12. The outside sound pressure or air pressure through the acoustic port 2 and the acoustic port 10 induces vibrations in the diaphragm over the MEMS die 11. The ASIC chip 5, MEMS die 11 and the PCB 1 are electrically interconnected by the metal wires 4 to input the signal to the PCB1 and then output the signal. The inventor of the present invention found that the existing technology has the following technological issues at least during achieving the present invention.

The sensitivity is a significant performance index of the directional MEMS microphone. For the above existing MEMS microphone, the sensitivity depends on the sound pressure entering the inside of the MEMS microphone to act on the diaphragm 11 through the acoustic port 2 and the acoustic port 10, respectively. As a result of size restriction, the back volume formed on the bottom of the MEMS microphone and the back cavity formed between the cover and the PCB are small, so the channels of the two acoustic ports can't be designed long enough, which leads to the sound pressure difference acting on the diaphragm 11 is minor, thereby the sensitivity difference being minor as well. Thus, sounds from various directions can all enter the inside of the MEMS microphone, and the background noise can't be eliminated by the means of sensitivity difference.

SUMMARY OF THE INVENTION

An object of the invention is to provide such a directional MEMS microphone comprising a tuning cavity which can remarkably improve the directivity performance of the conventional directional MEMS microphone.

According to a first aspect of the invention, there is provided a directional MEMS microphone comprising a microphone cover, a printed circuit board (PCB), a application specific integrated circuit (ASIC) chip, a MEMS die, a diaphragm, a damping, a metal wire (s), at least two internal acoustic ports, and at least two external acoustic ports corresponding to the internal acoustic ports. The microphone cover is coupled to the PCB to form a housing. The ASIC chip and the MEMS die are attached to the PCB within the housing. The diaphragm is attached to the MEMS die. The ASIC chip, the MEMS die and the PCB are electrically interconnected by the metal wires. The damping is secured to cover either one of the internal acoustic ports or one of the external acoustic ports corresponding to the internal acoustic ports. The internal acoustic ports include a first internal acoustic port which is disposed on the PCB within the housing and is corresponded to the position of the diaphragm and a second internal acoustic port which is disposed on the PCB within the housing and/or on the microphone cover. The external acoustic ports include a first external acoustic port disposed on the exterior of the housing and a second external acoustic port disposed on the exterior of the housing. The microphone further comprises a tuning cavity which includes a first tuning cavity by which the first internal acoustic port is coupled to the first external acoustic port, or by which the second internal acoustic port is coupled to the second external acoustic port.

Alternatively, the tuning cavity further includes a second tuning cavity by which the first internal acoustic port is coupled to the first external acoustic port, or by which the second internal acoustic port is coupled to the second external acoustic port.

Alternatively, the cross section area of the first/second tuning cavity is larger than that of the corresponding first/second internal acoustic port and larger than that of the corresponding first/second external acoustic port.

Alternatively, the distance between the first external acoustic port and the second external acoustic port is larger than the preset value or equal to the preset value.

Alternatively, the preset value is 3 mm.

Alternatively, the directional MEMS microphone also comprises a mesh which is disposed within the internal acoustic ports and/or within the external acoustic ports.

Alternatively, the internal acoustic ports and/or the external acoustic ports are provided with a meshed structure mainly formed by two or more apertures.

Alternatively, the directional MEMS microphone further comprises a tuning element which is attached to the PCB outside the housing.

Alternatively, the first tuning cavity and/or the second tuning cavity are disposed inside the tuning element, and the first external acoustic port and/or the second external acoustic port are disposed on the tuning element.

Alternatively, the tuning element comprises a body and a wire board. A connection between the tuning element and the PCB outside the housing is formed wherein the connection comprises attaching the body to the PCB outside the housing by the wire board between which and the body is a bonding adhesive.

Alternatively, the tuning element comprises a body, a tuning cover and a wire board. A connection between the tuning element and the PCB outside the housing is formed wherein the connection comprises attaching the body to the PCB outside the housing by the wire board between which and the body is a bonding adhesive. A protective volume which holds the microphone cover and the PCB is formed by connecting the wire board and the tuning cover. The first tuning cavity is disposed inside the body where the first external acoustic port is disposed, and the second tuning cavity is disposed inside the tuning cover where the second external acoustic port is disposed. According to a second aspect of the invention, there is also provided a receiver device comprising the above directional MEMS microphone.

Alternatively, the device comprises recording devices, mobile communication terminals, vehicle hands-free receivers, hearing aids, ultrasonic radar positioning devices or 3D position collection devices.

Compared with the prior art, one of the above technical schemes has the following advantages.

As a result of microphone size restriction in the prior art, the back volume formed on the bottom of the MEMS microphone and the back cavity formed between the cover and the PCB are small, so the channels of the two acoustic ports can't be designed long enough, which leads to the sound pressure difference acting on the diaphragm 11 is minor, thereby the sensitivity difference being minor as well. Thus, sounds from various directions can all enter the inside of the MEMS microphone, and the background noise can't be eliminated by means of sensitivity difference. Since the sensitivity difference depends on the sound pressures acting on the diaphragm from the two directions, the increase of the sensitivity difference is gained by increasing the sound pressure difference acting on the diaphragm of the directional MEMS microphone from the two directions. Thus, the embodiments of the present invention provide a directional MEMS microphone wherein the housing is connected to the outside world through the internal acoustic ports, the tuning cavity and the external acoustic ports in turn. The tuning cavity is a volume which has different dimensional shapes. The transmission distance of sound entering the inside of the microphone via different external acoustic ports is changed by setting various volumes of tuning cavities, thereby a larger sensitivity difference can be achieved by increasing the sound pressures acting on the diaphragm. Therefore, the background noise from a certain angle can be eliminated and the directivity of the directional MEMS microphone can be improved.

THE DRAWINGS

DETAILED DESCRIPTION

Figure 1A:
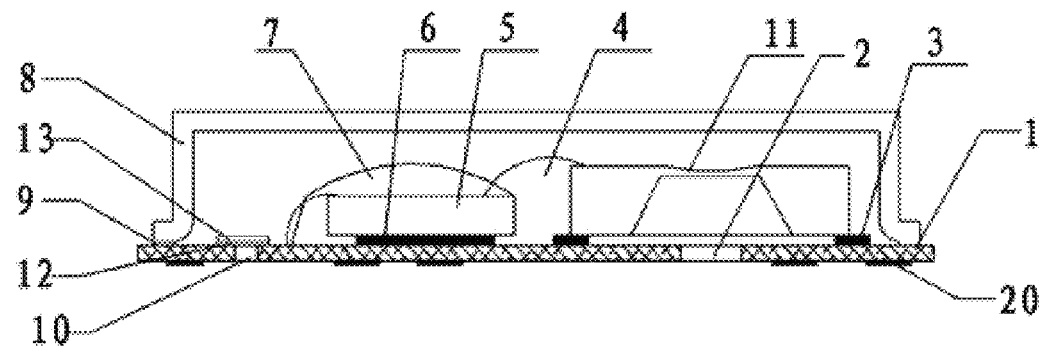
FIG. 1a is a schematic sectional view of the existing directional MEMS microphone.
Figure 1B:
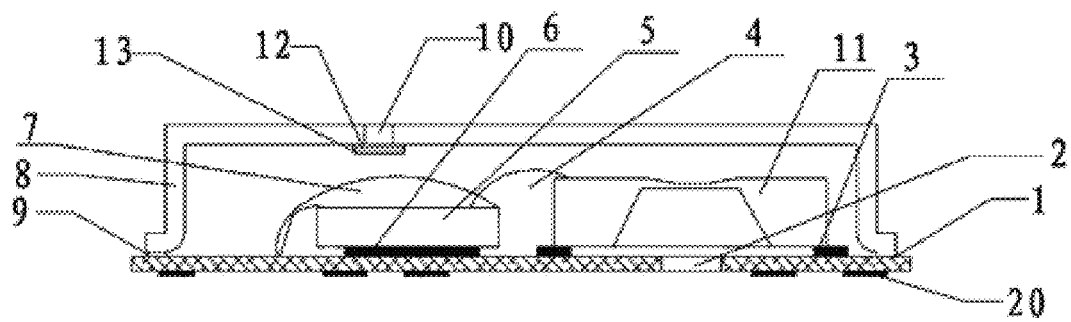
FIG. 1b is a schematic sectional view of the existing directional MEMS microphone.

The present invention will now be described by referring to the accompanying drawings that illustrate the preferred embodiments of the invention, from which its objects, features and advantages will be evident.

A first embodiment provides a directional MEMS microphone which comprises a microphone cover, a printed circuit board (PCB), a application specific integrated circuit (ASIC), a MEMS die, a diaphragm, a damping, a metal wire (s), at least two internal acoustic ports and external acoustic ports corresponding to the internal acoustic ports. The microphone cover is coupled to the PCB to form a housing. The ASIC chip and the MEMS die are attached to the PCB within the housing. The diaphragm is attached to the MEMS die. The ASIC chip, the MEMS die and the PCB are electrically interconnected by the metal wire (s). The damping is secured to cover either one of the internal acoustic ports or one of the external acoustic ports corresponding to the internal acoustic ports. The internal acoustic ports include a first internal acoustic port which is disposed on the PCB within the housing and is corresponded to the position of the diaphragm and a second internal acoustic port which is disposed on the PCB within the housing and/or on the microphone cover. The external acoustic ports include a first external acoustic port disposed on the exterior of the housing and a second external acoustic port disposed on the exterior of the housing. The microphone further comprises a tuning cavity which includes a first tuning cavity by which the first internal acoustic port is coupled to the first external acoustic port, or by which the second internal acoustic port is coupled to the second external acoustic port.

In the embodiments of the present invention, the tuning cavity disposed between the internal acoustic port and the external acoustic port is a volume which has a connecting function. A sound transmission channel is formed by combining the tuning cavity, the internal acoustic port and the external acoustic port. The sound from the outside world enters the tuning cavity through the external acoustic port and then enters the housing through the internal acoustic port. The tuning cavity may have a cylinderic, cubic, elongated or any other three-dimension shape with a dimensional volume. The tuning cavity may be disposed on the bottom, cover or any position of the directional MEMS microphone.

The tuning cavity includes a first tuning cavity which connects the first internal acoustic port and the first external acoustic port to form the sound transmission channel. Alternatively, the first tuning cavity may also connect the second internal acoustic port and the second external acoustic port to form the sound transmission channel. Herein this is not restricted by the present invention.

In another preferred embodiment of the present invention, the tuning cavity further includes a second tuning cavity which connects the first internal acoustic port and the first external acoustic port to form the sound transmission channel. Alternatively, the second tuning cavity may also connect the second internal acoustic port and the second external acoustic port to form the sound transmission channel.

Further, the cross section area of the first/second tuning cavity is larger than that of the corresponding first/second internal acoustic port and larger than that of the corresponding first/second external acoustic port, which increases relatively the volume of the tuning cavity, thereby increasing the sound transmission distance in the tuning cavity. Additionally, while achieving the present invention, the cross section area of the tuning cavity may also be smaller than that of the corresponding internal acoustic port and smaller than that of the corresponding external acoustic port. Herein this is not restricted by the present invention.

Further, the internal acoustic ports and/or the external acoustic ports are provided with a meshed structure mainly formed by two or more apertures, which prevents foreign materials from entering the inside of the microphone in order to keep the sound transmission channel unblocked. Further, a mesh may be disposed in the internal or external acoustic ports in order to prevent minor foreign materials from entering the inside of the microphone.

In the embodiment of the present invention, there are provided two sound transmission channels formed by the internal acoustic ports and the corresponding external acoustic ports. However, it should be understood by those skilled in the art that more sound transmission channels each of which is formed by the external acoustic port, the tuning cavity and the internal acoustic port may be provided in order to improve the directivity of the microphone while achieving the directional MEMS microphone provided by the present invention. The number of the sound transmission channels may be determined by those skilled in the art based on the specific demand while achieving the directional MEMS microphone provided by the present invention. Herein this is not restricted by the present invention.

The directional MEMS microphone refers to the directivity of the MEMS microphone. Taking the MEMS microphone with two acoustic ports as an example, the sensitivity depends on the sound pressure entering the inside of the MEMS microphone and acting on the diaphragm through the two acoustic ports, respectively. However, as a result of microphone size restriction in the prior art, the back volume formed on the bottom of the MEMS microphone and the back cavity formed between the cover and the PCB are small, so the channels of the two acoustic ports can't be designed long enough, which leads to the sound pressure difference acting on the diaphragm 11 is minor, thereby the sensitivity difference being minor as well. Thus, sounds from various directions can all enter the inside of the MEMS microphone, and the background noise can't be eliminated by the means of sensitivity difference. Since the sensitivity difference depends on the sound pressures acting on the diaphragm from the two directions, the increase of the sensitivity difference is gained by increasing the sound pressure difference acting on the diaphragm of the directional MEMS microphone from the two directions. Thus, the embodiments of the present invention provide a directional MEMS microphone wherein the housing is connected to the outside world through the internal acoustic ports, the tuning cavity and the external acoustic ports in turn. The tuning cavity is a volume which may have different dimensional shapes. The transmission distance of sound entering the inside of the microphone via different external acoustic ports is changed by setting various volumes of tuning cavities, thereby a larger sensitivity difference can be achieved by increasing the sound pressures acting on the diaphragm. Therefore, the background noise from a certain angle can be eliminated and the directivity of the directional MEMS microphone can be improved.

Figure 2:
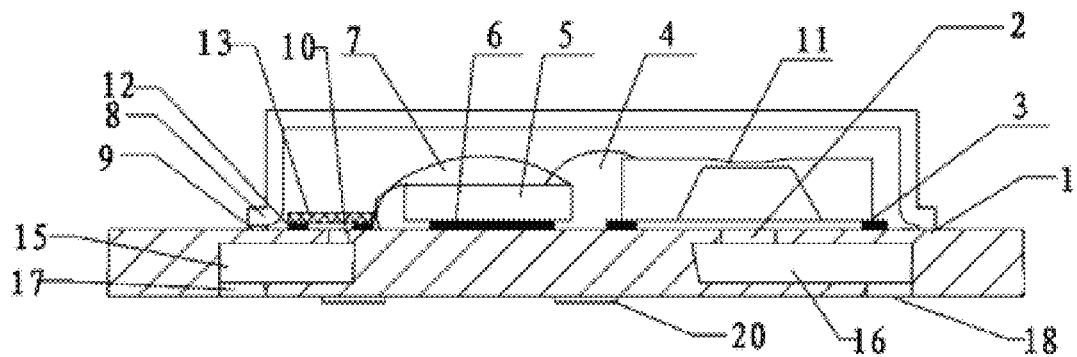
FIG. 2 is a schematic sectional view illustrating the directional MEMS microphone according to a second embodiment of the present invention.

In a second embodiment of the present invention, taking the sound transmission channels formed respectively by two groups of internal acoustic ports, tuning cavities and external acoustic ports as an example, the directional MEMS microphone provided by the present invention is depicted. Referring to FIG. 2, the directional MEMS microphone comprises a PCB 1, a internal acoustic port 2, a metal wire (s) 4, an ASIC chip 5, a microphone cover 8, a internal acoustic 10, a MEMS die 11, a diaphragm and damping 13, a tuning cavity 15, a tuning cavity 16, a external acoustic port 17, and a external acoustic port 18.

A housing is formed by connecting the microphone cover 8 and the PCB 1. More particularly, the microphone cover 8 and the PCB 1 are secured together by the cover bonding adhesive 9, solder paste, or other bonding materials. The ASIC chip 5 and the MEMS die 11 are attached on the PCB 1 within the housing. More particularly, the ASIC chip 5 is attached to the PCB 1 by the ASIC bonding adhesive 6 and is packaged by the coating adhesive 7. The MEMS die 11 is attached to the PCB 1 by the MEMS die bonding adhesive 3.

The diaphragm which is attached to the MEMS die 11 is not shown in FIG. 2. The ASIC chip 5, the MEMS die 11 and the PCB 1 are electrically interconnected by a metal wire (s) 4. Noted that the connection methods of ASIC chip 5, MEMS die 11 and PCB 1 in the embodiment are not to be construed a limiting to this invention. The damping 13 is secured to cover one of the internal acoustic ports or the external acoustic ports. Preferably, the damping 13 is secured to cover the internal acoustic port 10 in the embodiment. The internal acoustic port 2 is a first internal acoustic port which is disposed on the PCB 1 within the housing and is corresponded to the diaphragm position. The internal acoustic port 10 is the second internal acoustic port which may be disposed on the PCB 1 within the housing. The tuning cavity 16 which is disposed within the PCB 1 is a first tuning cavity and the tuning cavity 15 which is also disposed within the PCB 1 is a second tuning cavity. The external acoustic 18 which is disposed on the PCB 1 outside the housing is a first external acoustic and the external acoustic 17 which is also disposed on the PCB 1 outside the housing is a second external acoustic port. The internal acoustic port 2 is communicated with the external acoustic port 18 by the tuning cavity 16 and the internal acoustic port 10 is communicated with the external acoustic port 17 by the tuning cavity 15.

Preferably, in the embodiment illustrated, the cross section area of the tuning cavity 16 is larger than that of the internal acoustic port 2 and larger than that of the external acoustic port 18, and the cross section area of the tuning cavity 15 is larger than that of the internal acoustic port 10 and larger than that of the external acoustic port 17. The resonant frequency is affected by the volume of the tuning cavity which is changed by adjusting the different cross section area of the tuning cavity. The larger the volume of the tuning cavity is, the lower the resonant frequency is.

In another preferred embodiment, the distance between the first external acoustic port and the second external acoustic port is larger than the preset value or equal to the preset value. The inventor of the present invention found that the sensitivity difference between the two directions is adjusted by changing the distance between the internal acoustic port and the external acoustic port. Preferably, the preset value is 3 mm.

The two sound signals acting respectively on the front and rear of the diaphragm produce a phase difference because the two signals come from one source while have different paths. With the angle changing, the phase differences are various, and the combined forces applied on the diaphragm are different as well. Therefore, the directivity which is normally shown by a polarity pattern is produced. Referring to the following polarity patterns, the influence on sensitivity difference between the two directions by changing the distance between the internal acoustic port and the external acoustic port is disclosed.

Figure 2A:
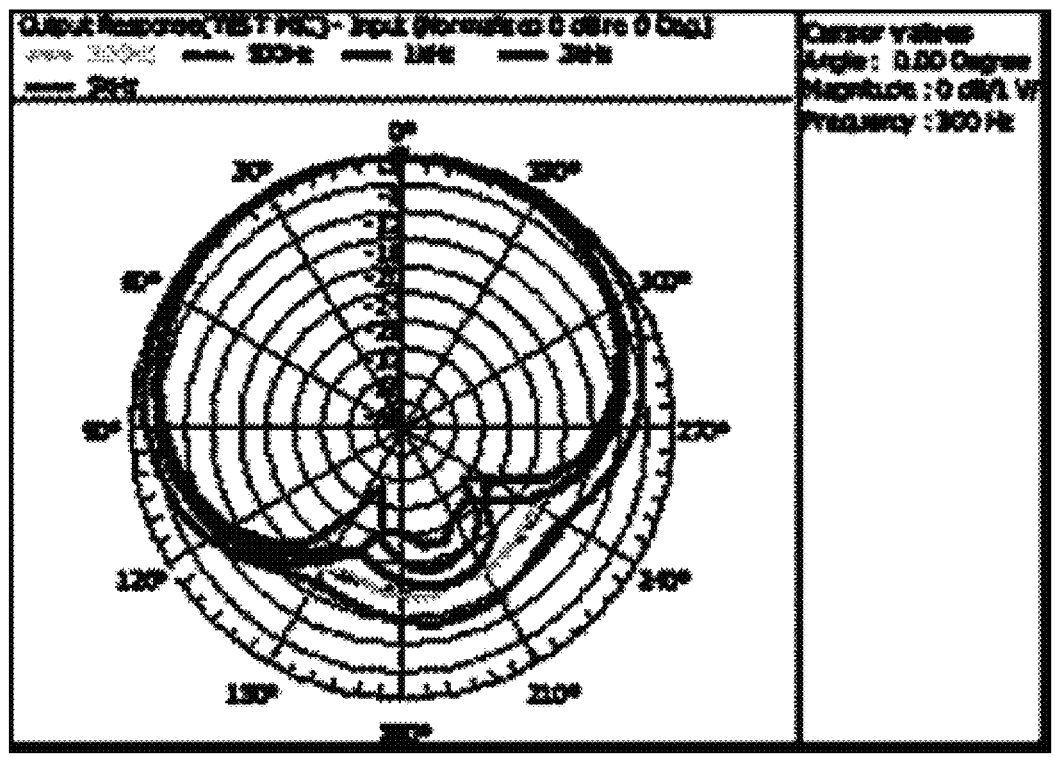
FIG. 2a is a polarity pattern of the directional MEMS microphone according to an embodiment of the present invention.
Figure 2B:
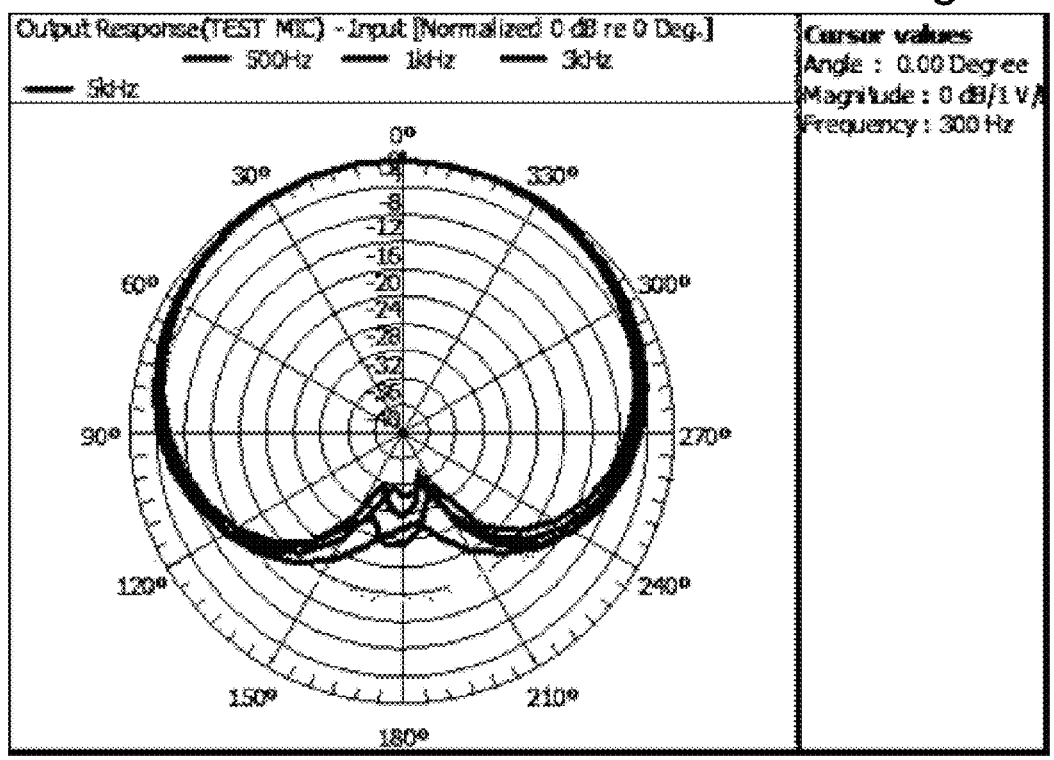
FIG. 2b is a polarity pattern of the directional MEMS microphone according to an embodiment of the present invention.
Figure 2C:
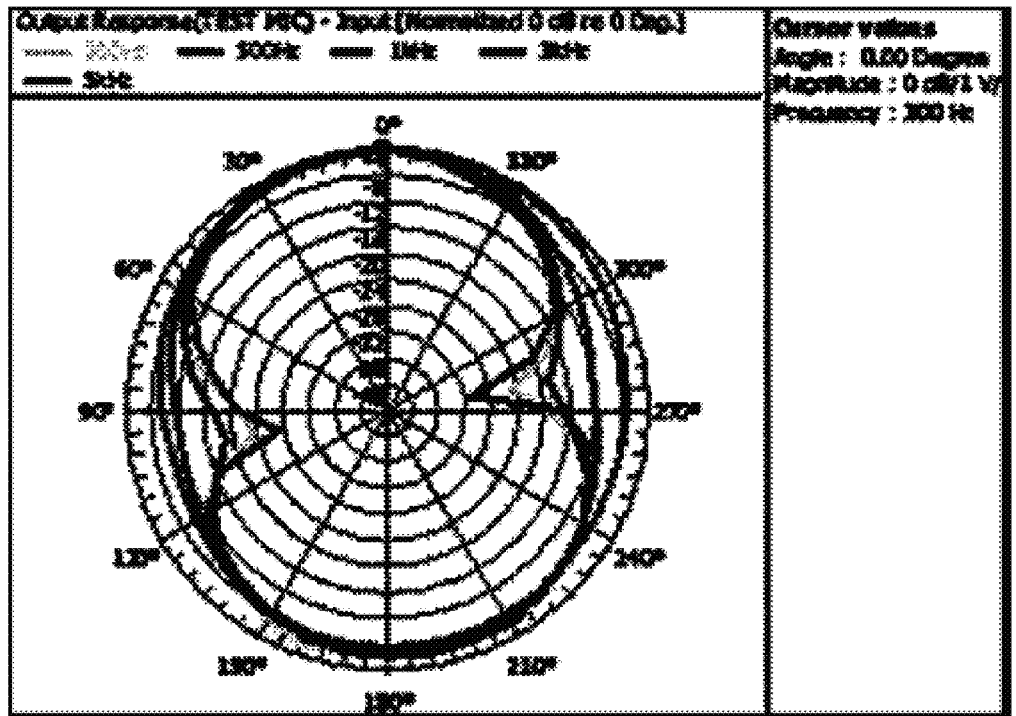
FIG. 2c is a polarity pattern of the directional MEMS microphone according to an embodiment of the present invention.
Figure 3A:
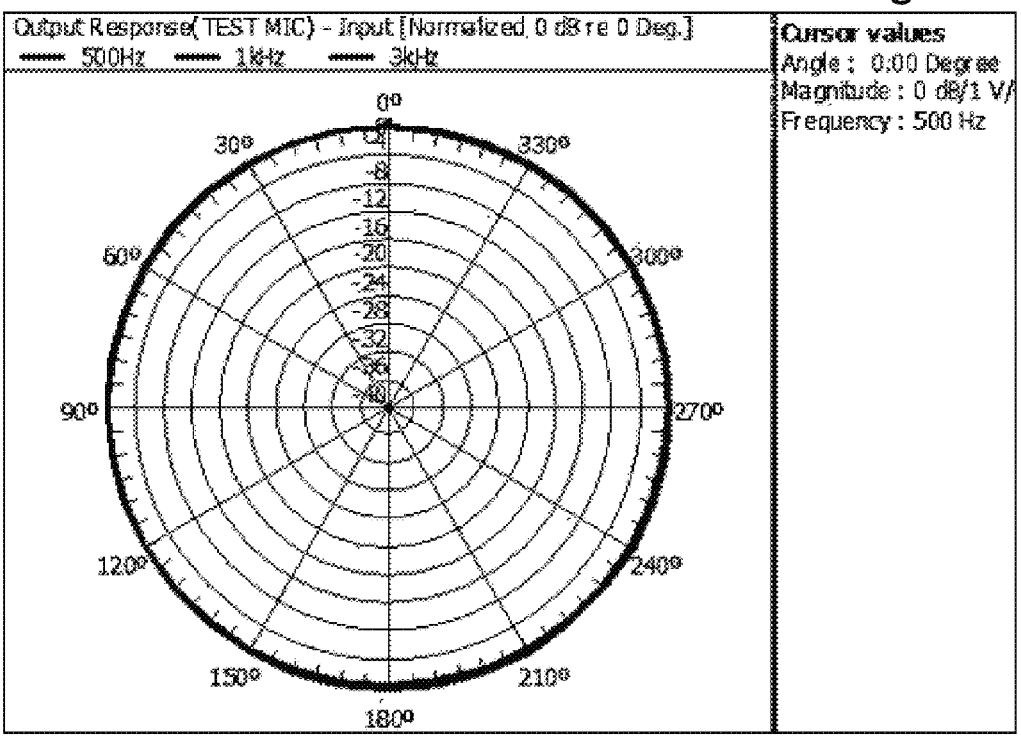
FIG. 3a is a polarity pattern of the conventional directional MEMS microphone without the tuning cavity.
Figure 3B:
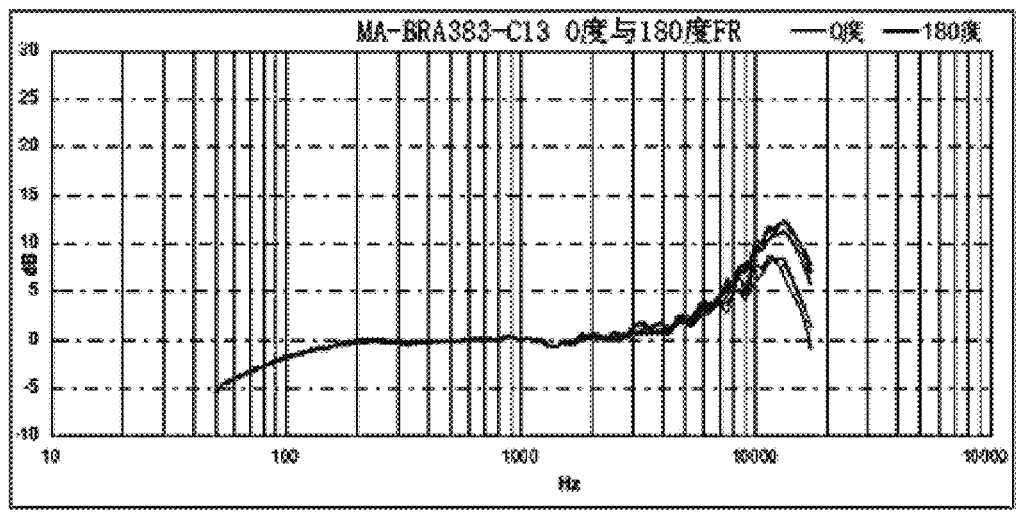
FIG. 3b is a frequency response curve of the conventional directional MEMS microphone without the tuning cavity.
Figure 3C:
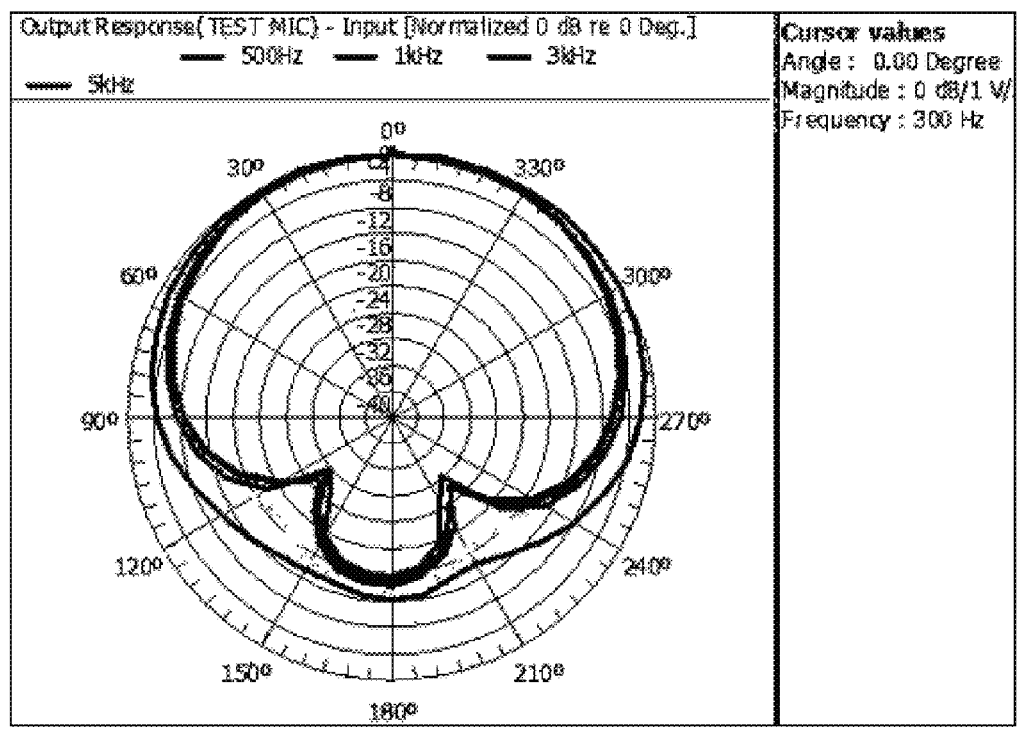
FIG. 3c is a polarity pattern of the directional MEMS microphone according to the first embodiment of the present invention.
Figure 3D:
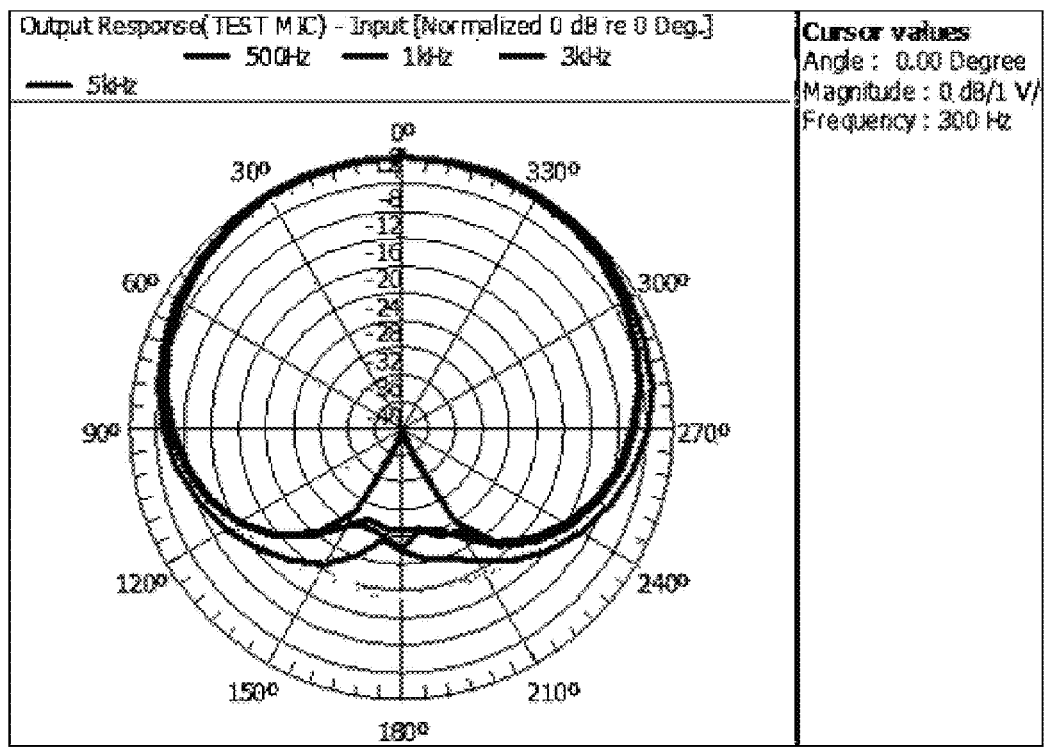
FIG. 3d is a polarity pattern of the directional MEMS microphone according to the first embodiment of the present invention.
Figure 3E:
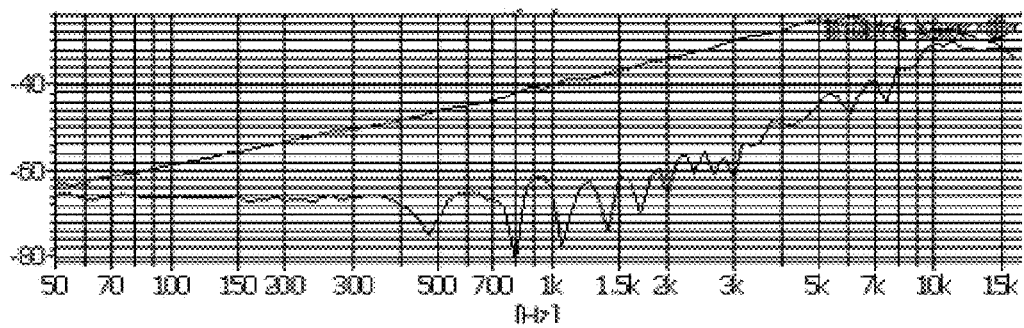
FIG. 3e is a frequency response curve of the directional MEMS microphone according to the first embodiment of the present invention.

Referring to FIG. 2a, a first polarity pattern is illustrated when the distance between external acoustic ports is appropriately 15 mm;

Referring to FIG. 2b, a second polarity pattern is illustrated when the distance between external acoustic ports is appropriately 10 mm;

Referring to FIG. 2c, a third polarity pattern is illustrated when the distance between external acoustic ports is appropriately 5 mm.

It should be understood by those skilled in the art that the distance between external acoustic ports may be defined according to actual demands while achieving the invention. Herein this is not specially restricted by the present invention.

In the embodiment of the present invention, the directivity is mutually determined by distance between the external acoustic ports and the damping. If the distance is defined, the sensitivity difference is adjusted by the damping size. The changes of the sensitivity is achieved by adjust the density, material and sound absorption degree of the damping.

Based on the embodiment of the present invention, there is provided a directional MEMS microphone. The sound pressure or air pressure of the outside world enters the housing of the directional MEMS microphone through the external acoustic port 18, the tuning cavity 16 and internal acoustic port 2 in turn, and the sound pressure or air pressure of the outside world enters the housing of the directional MEMS microphone through the external acoustic port 17, the tuning cavity 16 and internal acoustic port 10 in turn. The sound transmission channel is elongated by the external acoustic port, the tuning cavity and the internal acoustic port in order to produce a larger sensitivity difference for the directional MEMS microphone, thereby eliminating the background noise from a certain angle and improving the directivity of the directional MEMS microphone.

Referring to the following polarity patterns and the frequency response curves, compared with the existing microphone, the microphone in the embodiment of the present invention has a better directivity.

Compared with the existing microphone, the directional MEMS microphone provided by the embodiment of the present invention has a better performance to eliminate the background noise from a certain angle and has a better directivity while the existing directional MEMS microphone without the tuning cavity can't eliminate the background noise.

Figure 4:
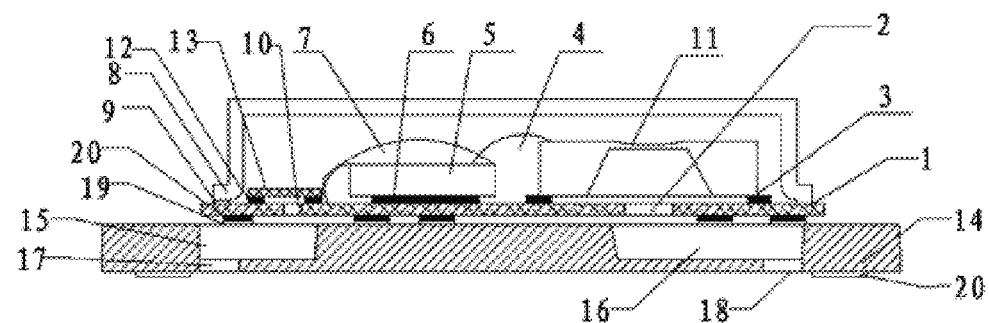
FIG. 4 is a schematic sectional view illustrating the directional MEMS microphone according to a third embodiment of the present invention.

A third embodiment of a directional MEMS microphone of the present invention is illustrated in FIG. 4. Compared with the second embodiment, the directional MEMS microphone provided by the third embodiment further comprises a tuning element 14 which is coupled to the PCB 1 outside the housing; the external acoustic port 17 and 18 are disposed on the tuning element 14, and the tuning cavity 15 and 16 are disposed inside the tuning element 14. Particularly, the tuning element 14 may be made of metal or non-metal material.

In the second embodiment of the directional MEMS microphone, as the tuning cavity with a volume is disposed inside the PCB 1 which has a limited thickness, the difficulty of manufacturing process increased. However, in the third embodiment of the directional MEMS microphone, the tuning element 14 is coupled to the PCB 1 and the tuning cavity with a volume is disposed inside the tuning element 14. As the thickness of the tuning element 14 can be regulated, the volume of the tuning cavity can be easily adjusted according to the actual demands in order to achieve the optimized directivity. Meanwhile, the complexity of manufacturing process is significantly reduced and the production cost is saved.

Figure 5A:
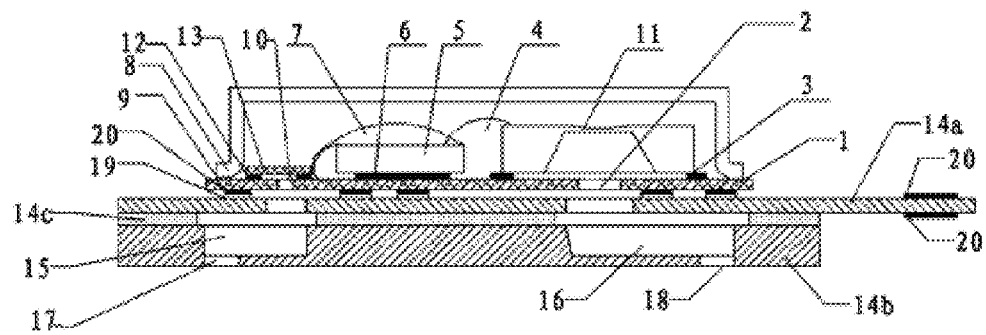
FIG. 5a is a schematic sectional view illustrating the directional MEMS microphone according to an embodiment of the present invention expanded from the third embodiment.

In another embodiment expanded from the embodiment illustrated in FIG. 5a, the tuning element 14 includes a wire board 14a and a body 14b which is attached to the PCB 1 outside the housing via the wire board 14a by a adhesive 14c disposed between the body and the wire board.

Figure 5B:
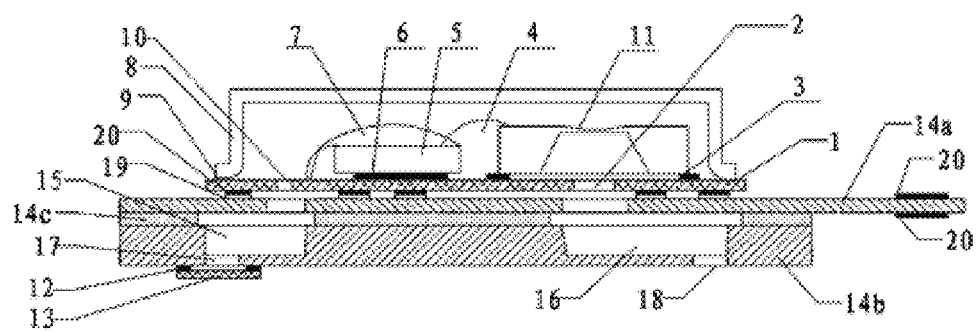
FIG. 5b is a schematic sectional view illustrating the directional MEMS microphone according to an embodiment of the present invention expanded from the third embodiment.
Figure 5C:
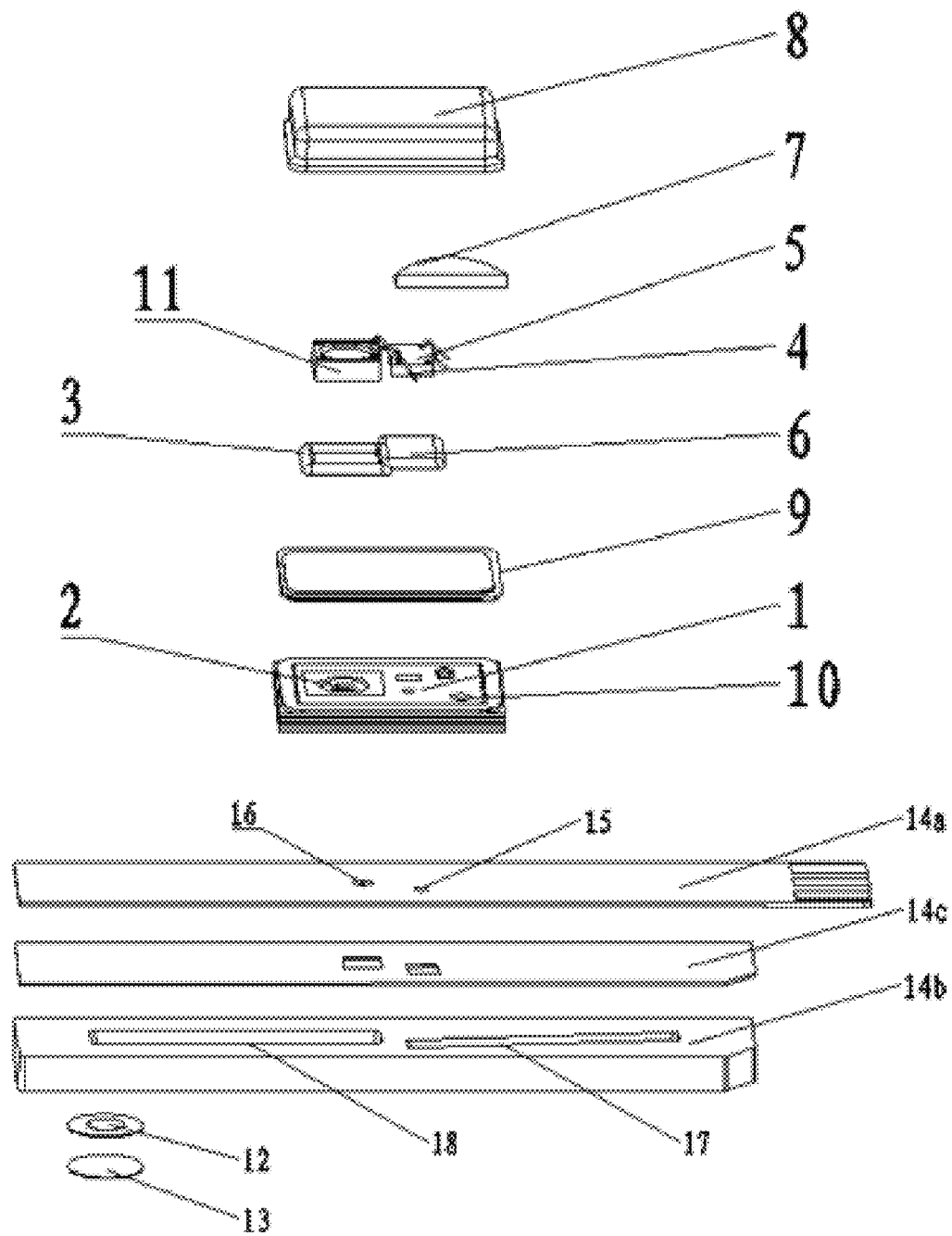
FIG. 5c is a schematic assembly view illustrating the directional MEMS microphone of FIG. 5b.

In another embodiment expanded from the embodiment illustrated in FIG. 5b, the damping 13 covers the external acoustic port 17. The assembly schematic view of the directional MEMS microphone shown in FIG. 5b is illustrated in FIG. 5c.

The distinction of the MEMS microphones illustrated in FIG. 5a and FIG. 5b is that the damping of the directional MEMS microphone illustrated in FIG. 5b is disposed on the external acoustic port while the damping of the directional MEMS microphone illustrated in FIG. 5a is disposed on the internal acoustic port. As the sound intensity transmitted in the corresponding sound transmission channel can be changed by adjusting the damping and the directivity of the directional MEMS microphone depends on the difference of sound intensities transmitted in the two sound transmission channels formed respectively by two group of external acoustic ports, tuning cavities and internal acoustic ports, the directivity of the directional MEMS microphone can be regulated by adjusting the damping. Compared with the damping disposed on the internal acoustic port, the damping on the external acoustic port can be adjusted by those skilled in the art without opening the housing in order to regulate the directivity of the directional MEMS microphone.

Figure 6:
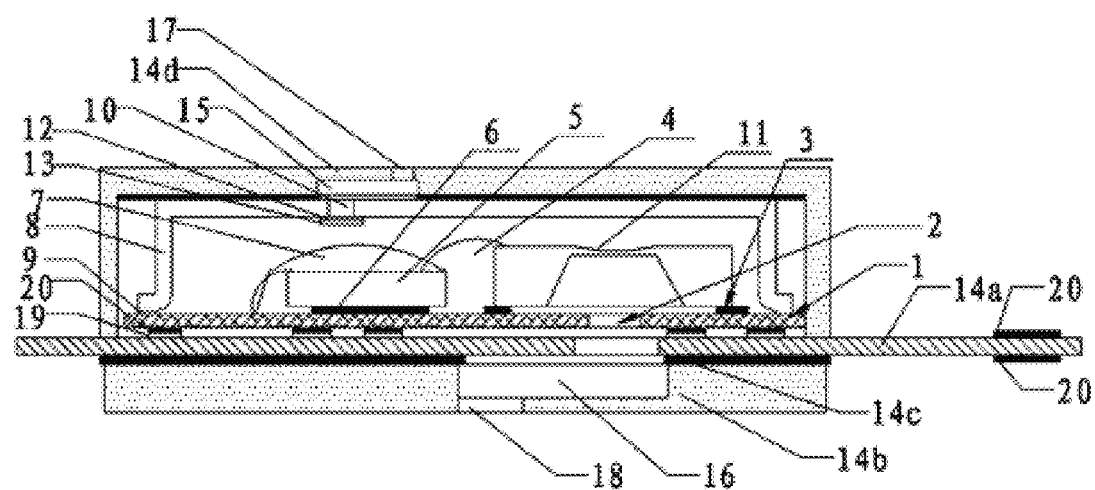
FIG. 6 is a schematic sectional view illustrating the directional MEMS microphone according to a fourth embodiment of the present invention.

A fourth embodiment of a directional MEMS microphone of the present invention is illustrated in FIG. 6. In the directional MEMS microphone provided by the embodiment, the tuning element 14 includes a wire board 14a, a body 14b and a tuning cover 14d. The body 14b is attached to the PCB 1 outside the housing via the wire board 14a by a adhesive 14c disposed between the body 14b and the wire board 14a, and a protective volume which holds the microphone cover 8 and the PCB 1 is formed by connecting the wire board 14a and the tuning cover 14d. The tuning cavity 16 is disposed inside the body 14b and the external acoustic port 18 is disposed on the body 14b. The tuning cavity 15 is disposed inside the tuning cover 14d and the external acoustic port 17 is disposed on the tuning cover 14d. The internal acoustic port 10 is disposed on the microphone cover 8. The protective volume which holds the microphone cover 8 and the PCB 1 is formed for shielding the directional MEMS microphone by connecting the wire board 14a and the tuning cover 14d.

In another embodiment expanded from the embodiment, the tuning element 14 includes a first tuning element and a second tuning element which are both disposed on the bottom of the directional MEMS microphone and coupled to the PCB 1 outside the housing. The internal acoustic port 10 is disposed on the PCB 1 inside the housing.

All embodiments in the description of the present invention are depicted in a progressive manner, and each embodiment focuses on the distinction from other embodiments. Refer to one another for the same or similar contents of embodiments. A MEMS microphone and a receiver device provided by the present invention herein are depicted in detail. All examples and conditional language recited are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A directional microelectromechanical system (MEMS) microphone, comprising:
   a microphone cover;
   a printed circuit board (PCB) which is coupled to the microphone cover to form a housing;
   a application specific integrated circuit (ASIC) chip which is attached to the PCB within the housing;
   a MEMS die which is attached to the PCB within the housing;
   a diaphragm which is attached to the MEMS die;
   a metal wire(s) by which the ASIC chip, the MEMS die and the PCB are electrically interconnected;
   at least two internal acoustic ports including a first internal acoustic port which is disposed on the PCB within the housing and is corresponded to the position of the diaphragm and a second internal acoustic port which is disposed on the PCB within the housing and/or on the microphone cover;
   at least two external acoustic ports corresponding to the internal acoustic ports and including a first external acoustic port disposed on the exterior of the housing and a second external acoustic port disposed on the exterior of the housing; and
   a damping which is secured to cover one of the internal acoustic ports or one of the external acoustic ports corresponding to the internal acoustic ports; and
   the microphone further comprising:
   a first tuning cavity by which the first internal acoustic port is communicated with the first external acoustic port, and a second tuning cavity by which the second internal acoustic port is communicated with the second external acoustic port.

2. The directional MEMS microphone of claim 1 wherein the cross section area of the first/second tuning cavity is larger than that of the corresponding first/second internal acoustic port and larger than that of the corresponding first/second external acoustic port.

3. The directional MEMS microphone of claim 1 wherein the distance between the first external acoustic port and the second external acoustic port is larger than a preset value or equal to the preset value, the preset value being in the range from 3 mm to 15 mm.

4. The microphone of claim 3 wherein the preset value is 3 mm.

5. The directional MEMS microphone of claim 1 wherein the directional MEMS microphone further comprises a tuning element which is attached to the PCB outside the housing.

6. The directional MEMS microphone of claim 5 wherein the first tuning cavity and/or the second tuning cavity are disposed inside the tuning element, and the first external acoustic port and/or the second external acoustic port are disposed on the tuning element.

7. The directional MEMS microphone of claim 6 wherein the tuning element comprising a body and a wire board, and a connection between the tuning element and the PCB outside the housing being formed wherein the connection comprising attaching the body to the PCB outside the housing by the wire board between which and the body is a bonding adhesive.

8. The directional MEMS microphone of claim 6 wherein the tuning element comprising a body, a tuning cover, and a wire board; a connection between the tuning element and the PCB outside the housing being formed wherein the connection comprising attaching the body to the PCB outside the housing by the wire board between which and the body is a bonding adhesive, a protective volume which holds the microphone cover and the PCB being formed by connecting the wire board and the tuning cover, the first tuning cavity being disposed inside the body where the first external acoustic port is disposed, and the second tuning cavity being disposed inside the tuning cover where the second external acoustic port is disposed.

9. A receiver device, comprising:
   a directional MEMS microphone as claimed in claim 1.

10. The receiver device of claim 9 wherein the device comprises recording devices, mobile communication terminals, automotive hands-free receivers, hearing aids, ultrasonic radar locating devices, or 3D position collection devices.

* * * * *